United States Patent
Zhu et al.

(10) Patent No.: US 9,745,652 B2
(45) Date of Patent: Aug. 29, 2017

(54) ZR-BASED AMORPHOUS ALLOY

(71) Applicant: Huawei Technologies Co., Ltd., Shenzhen, Guangdong (CN)

(72) Inventors: Ailan Zhu, Shenzhen (CN); Tao Zhang, Shenzhen (CN); Qiang He, Shenzhen (CN); Liang Fu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 640 days.

(21) Appl. No.: 14/143,270

(22) Filed: Dec. 30, 2013

(65) Prior Publication Data

US 2014/0146453 A1    May 29, 2014

Related U.S. Application Data

(63) Continuation of application No. PCT/CN2013/073865, filed on Apr. 8, 2013.

(30) Foreign Application Priority Data

Nov. 26, 2012  (CN) .......................... 2012 1 0486768

(51) Int. Cl.
 *C22C 45/10* (2006.01)
 *H01L 23/06* (2006.01)
 *H05K 5/04* (2006.01)
 *C22C 1/00* (2006.01)

(52) U.S. Cl.
 CPC .............. *C22C 45/10* (2013.01); *C22C 1/002* (2013.01); *H01L 23/06* (2013.01); *H05K 5/04* (2013.01); *H01L 2924/0002* (2013.01)

(58) Field of Classification Search
 CPC .......... C22C 1/002; C22C 45/10; H05K 5/04; H01L 21/50; H01L 23/298; H01L 2924/0002
 See application file for complete search history.

(56) References Cited

U.S. PATENT DOCUMENTS

| | | | |
|---|---|---|---|
| 2003/0079813 A1 | 5/2003 | Zhang et al. | |
| 2011/0094633 A1 | 4/2011 | Gong et al. | |
| 2011/0097237 A1 | 4/2011 | Gong et al. | |
| 2012/0222780 A1 | 9/2012 | Yuan et al. | |

FOREIGN PATENT DOCUMENTS

| | | |
|---|---|---|
| CN | 1351192 A | 5/2002 |
| CN | 101012534 A | 8/2007 |
| CN | 101235472 A | 8/2008 |
| CN | 102041461 A | 5/2011 |
| CN | 102041462 A | 5/2011 |
| CN | 102080196 A | 6/2011 |
| CN | 102529192 A | 7/2012 |
| CN | 102965599 A | 3/2013 |

OTHER PUBLICATIONS

Djakonova et al., "On the synthesis of Zr-based bulk amorphous alloys from glass-forming compounds and elemental powders", Journal of Alloys and Compounds, 2004, Elsevier, vol. 367, 191-198.*
Qing et al., English machine translation of CN102529192A, Jul. 2012, pp. 1-22.*
Yiming Chen, et al., "The Application of Rare Earth Element in Amorphous Alloy", Nov. 25, 2010, pp. 495-498.
Zhao Xiangjin, et al., "Fabrication of (Zr0.55A10.10Ni0.05Cu0.30)98Er2 Porous Glassy Alloys by Rapid Casting Method", Huawei Tech. Co., Ltd., Oct. 2008, 11 pages.
Wei Hua Wang, et al., "Role of addition in formation and properties of Zr-based bulk metallic glasses", Intermetallics, vol. 10, No. 11-12, Nov. 1, 2002, pp. 1249-1257.
Jun Luo, et al., "Effects of Yttrium and Erbium Additions on Glass-Forming Ability and Mechanical Properties of Bulk Glassy Zr—Al—Ni—Cu Alloys", Materials Transactions, vol. 47, No. 2, Feb. 15, 2006, pg. 450-453.
Woyun Long, et al., "Research on Zr50Al15-xNi10Cu25Yx amorphous alloys prepared by mechanical alloying with commercial pure element powders", Physica B. Condensed Matter, vol. 406, No. 3, Feb. 1, 2011, pp. 503-507.
Cang Fan, et al., "As-cast Zr-Ni-Cu-Al-Nb bulk metallic glasses containing nanocrystalline particles with ductility", Materials Science and Engineering, vol. 431, No. 1-2, Sep. 15, 2006, pg. 158-165.
Shantanu V. Madge, et al., "Mechanical behaviour of Zr-La-Cu-Ni-Al glass-based composites", Intermetallics, vol. 19, No. 10, May 19, 2011, pg. 1474-1478.

* cited by examiner

*Primary Examiner* — Roy King
*Assistant Examiner* — Caitlin Kiechle

(57) ABSTRACT

A Zr-based amorphous alloy is provided; the formula of the Zr-based amorphous alloy is $(Zr, Hf, Nb)_a Cu_b Ni_c Al_d Re_e$, where a, b, c, d, and e are corresponding atomic percent content of elements in the Zr-based amorphous alloy, $45 \leq a \leq 65$, $15 \leq b \leq 40$, $0.1 \leq c \leq 15$, $5 \leq d \leq 15$, $0.05 \leq e \leq 5$, $a+b+c+d+e \leq 100$, and Re is one of or any combination of elements La, Ce, Po, Ho, Er, Nd, Gd, Dy, Sc, Eu, Tm, Tb, Pr, Sm, Yb, and Lu, or Re is combined with Y and one of or any combination of elements La, Ce, Po, Ho, Er, Nd, Gd, Dy, Sc, Eu, Tm, Tb, Pr, Sm, Yb, and Lu.

12 Claims, 1 Drawing Sheet

ZR-BASED AMORPHOUS ALLOY

CROSS-REFERENCE TO RELATED APPLICATIONS

This application is a continuation of International Application No. PCT/CN2013/073865, filed on Apr. 8, 2013, which claims priority to Chinese Patent Application No. 201210486768.5, filed on Nov. 26, 2012, both of which are hereby incorporated by reference in their entireties.

TECHNICAL FIELD

The present invention relates to the field of metal alloys, and in particular, to a zirconium-based (Zr-based) amorphous alloy.

BACKGROUND

Due to a lack of a long-range order of an atomic arrangement of an amorphous alloy, neither dislocation nor grain boundary exists in the structure of the alloy. Therefore, compared with ordinary polycrystalline metal materials, amorphous alloys have merits such as high intensity, corrosion resistance, and abrasion resistance, and may be used as raw materials for manufacturing microelectronic devices, sports utilities, luxury goods, consumer electronics, and the like. A general method for manufacturing an amorphous alloy is to cool an alloy melt quickly to be below a glass transformation temperature ($T_g$) at a certain cooling speed. The extremely fast cooling speed avoids crystal nucleation and growth, and finally accomplishes a completely amorphous structure. If the cooling speed required for turning a material into an amorphous structure is lower, it is easier to form a large-sized amorphous structure of the material. In alloy systems such as Zr-based, palladium-based, magnesium-based, iron-based, copper-based, and lanthanum-based alloy systems, the critical cooling speed of specific alloys is less than 10 K/second in magnitude, and bulk amorphous alloys of a thickness of a centimeter magnitude may be manufactured through copper mold casting.

Generally, a critical diameter that can form a cast round bar of a completely amorphous structure is used as glass forming ability (GFA) of the alloy. The glass forming ability of the alloy primarily depends on chemical components of the alloy. Complexity and diversity of the alloy components can reduce the critical cooling speed of forming the amorphous structure and improve the glass forming ability of the alloy. Among them, a multi-element Zr-based amorphous alloy is an amorphous alloy that has ever been discovered so far having a good glass forming ability and superb mechanical and machining properties, and taking on the best application prospect of structural materials.

The Zr-based amorphous alloys that have been developed so far for forming an amorphous structure in the world centrally exist in the Zr-TM-Al or Zr-TM-Be (TM is Ti, Cu, Ni, or Co) system. With certain components of such alloys, a melt may cool down to form an amorphous round bar material of a diameter greater than 10 mm. Currently, the manufacturing of such alloys occurs primarily in labs. The oxygen content in an alloy is generally less than 200 ppm. Therefore, the oxygen content existent in the raw material and introduced in the manufacturing process must be controlled strictly.

For example, the following alloy formula can form an amorphous structure of a certain size after being cast:

$$(Zr,Hf)aMbAlc,$$

where M is Ni, Cu, Fe, Co, or any combination thereof; a, b, and c are atomic percents, $25 \leq a \leq 85$, $5 \leq b \leq 70$, and $0 < c \leq 35$. Preferably, after vacuum melting and ordinary copper mold casting, the Zr50Cu40Al10 alloy can form a completely amorphous round bar of a 10 mm diameter, that is, have a glass forming ability of 10 mm.

To further enhance the glass forming ability of the alloy, a proper amount of Ni is generally added into the alloy, and combines with Cu into a specific formula. For example, after 5 at. % of Ni is added into the alloy, a four-element Zr55Cu30Ni5Al10 alloy is obtained, whose glass forming ability is up to 30 mm. A general manufacturing method is as follows: Place a specific quantity of raw materials of a specific formula into a vacuum smelting furnace, adjust the vacuum degree to $5 \times 10^{-3}$ Pa, and then charge with 0.05 MPa argon as protection gas; after homogeneous smelting and cooling with the furnace, obtain a master alloy; subsequently, place the master alloy into an induction furnace for re-melting, and then spray and cast the master alloy into a copper mold to obtain amorphous alloy bars.

The GFA of a Zr-based alloy in the prior art is very sensitive to oxygen content of the alloy. Because cohesion of zirconium and oxygen occurs very easily, zirconium oxide or zirconium/oxygen clusters can be generated easily in the alloy melt. They may serve as a core of non-homogeneous nucleation, and reduce the GFA of the alloy. Under ordinary laboratory or industrial conditions, a certain amount of oxygen is inevitably introduced into the Zr-based amorphous alloy. Therefore, expensive high-purity raw materials have to be used in the production process, and a high vacuum degree is required in smelting and casting processes. The required vacuum degree is over $10^{-2}$ Pa or even $10^{-3}$ Pa to prevent decrease of the amorphous GFA caused by high oxygen content in the alloy. High-purity (a purity of over 99.9%) raw materials and stringent protection atmosphere lead to very high costs of manufacturing a Zr-based amorphous alloy, and make mass production impracticable. Ordinary industrial raw materials in the market are not good enough for manufacturing components and products of an amorphous structure of specific dimensions.

SUMMARY

Embodiments of the present invention provide a Zr-based amorphous alloy that ensures the capability of forming an amorphous bulk on the basis of lower process requirements such as a lower material purity and a lower casting environment vacuum degree.

An embodiment of the present invention provides a Zr-based amorphous alloy, where the Zr-based amorphous alloy has the following formula:

$$(Zr,Hf,Nb)_a Cu_b Ni_c Al_d Re_e,$$

where a, b, c, d, and e are corresponding atomic percent content of elements in the Zr-based amorphous alloy, $45 \leq a \leq 65$, $15 \leq b \leq 40$, $0.1 \leq c \leq 15$, $5 \leq d \leq 15$, $0.05 \leq e \leq 5$, $a+b+c+d+e \leq 100$, and Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu.

A method for manufacturing a Zr-based amorphous alloy, including: melting metal raw materials completely under a protection atmosphere or vacuum condition, and then performing casting, cooling, and molding to form a Zr-based amorphous alloy, where the Zr-based amorphous alloy has the following formula:

$$(Zr,Hf,Nb)_a Cu_b Ni_c Al_d Re_e,$$

where a, b, c, d, and e are corresponding atomic percent content of elements in the Zr-based amorphous alloy, 45≤a≤65, 15≤b≤40, 0.1≤c≤15, 5≤d≤15, 0.05≤e≤5, a+b+c+d+e≤100, and Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu.

An electronic device, including a casing and electronic components placed in the casing, where the casing is made of a Zr-based amorphous alloy, and the Zr-based amorphous alloy has the following formula:

$$(Zr,Hf,Nb)_a Cu_b Ni_c Al_d Re_e,$$

where a, b, c, d, and e are corresponding atomic percent content of elements in the Zr-based amorphous alloy, 45≤a≤65, 15≤b≤40, 0.1≤c≤15, 5≤d≤15, 0.05≤e≤5, a+b+c+d+e≤100, and Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu.

In the embodiments of the present invention, trace quantities of rare earth elements (0.05-5 atomic percent) are added into an alloy to suppress a crystallization trend and improve melt stability; the rare earth elements can absorb oxygen in the alloy, adjust oxygen content of the alloy, suppress heterogeneous nucleation, avoid crystallization of liquid metal in a cooling process, enhance glass forming ability of the alloy, thereby widening the choice range of raw materials required for manufacturing an amorphous alloy. Moreover, a product of a high glass forming ability can be manufactured without using high-purity raw materials, and we can further reduce process requirements such as vacuum degree, which slashes production costs.

BRIEF DESCRIPTION OF DRAWINGS

To illustrate the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
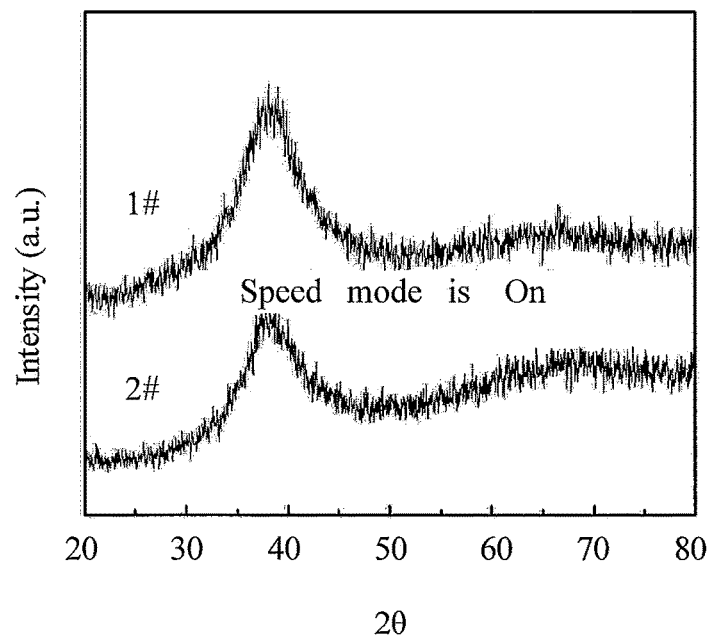
FIG. 1 is an XRD diffraction analysis result diagram of a Zr-based amorphous alloy of two components according to an embodiment of the present invention.

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The present invention provides an easily formable Zr-based amorphous alloy, where the Zr-based amorphous alloy of an amorphous structure maybe subjected to an ordinary copper mold casting method or a conventional parts casting method to generate amorphous bulk materials or parts of an amorphous structure. The Zr-based amorphous alloy includes Zr, Ni, Cu, Al, and one or more elements of rare earth, in which Zr may be partly replaced with Hf and Nb. An atomic percent of each element in the final amorphous alloy fulfills the following general formula:

$$(Zr,Hf,Nb)_a Cu_b Ni_c Al_d Re_e,$$

where a, b, c, d, and e are corresponding atomic percent content of elements in the Zr-based amorphous alloy, 45≤a≤65, 15≤b≤40, 0.1≤c≤15, 5≤d≤15, 0.05≤e≤5, a+b+c+d+e≤100, and Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding misch metal (Misch Metal, expressed by MM in the molecular formula). In some embodiments, the Re is preferably one of or any combination of elements La, Nd, Dy, Er, Tm, and Yb.

For example, in some embodiments, the Zr-based amorphous alloy may include the following components: Zr63Ni10Cu17.5Al7.5Er2, Zr46.9Ni8Cu36Al8Er0.1Y1, Zr54.5Cu30Al10Ni5Tm0.5, Zr63Hf1.5Cu18Ni10Al7Yb0.5, Zr53.5Hf1Cu30Ni5Al10(Y, Er)0.5, Zr60.5Hf2Cu19Ni10Al8Nd0.5, Zr50Cu35Al10Ni4Yb1, Zr47Hf0.5Cu36Ni8Al8Er0.5, and the like.

With the Zr-based amorphous alloy in the foregoing range of components, an alloy ingot of a bar shape, granule shape, or strip shape maybe obtained first through arc melting or induction melting by using low-purity raw materials at a low vacuum degree (lower than $1 \times 10^{-2}$ Pa), and then the alloy ingot is re-melted or cast at a low vacuum degree (lower than $1 \times 10^{-2}$ Pa) to obtain an amorphous bar or amorphous part of a relatively large size.

The present invention provides a method for manufacturing a Zr-based amorphous alloy of the foregoing molecular formula. The method includes: setting corresponding atomic percent content of elements of a Zr-based amorphous alloy of the foregoing $(Zr, Hf, Nb)_a Cu_b Ni_c Al_d Re_e$ in the Zr-based amorphous alloy to 45≤a≤65, 15≤b≤40, 0.1≤c≤15, 5≤d≤15, 0.05≤e≤5, and a+b+c+d+e≤100 respectively; melting such components into a master alloy until they are fully blended homogeneously; and performing casting and cooling for the master alloy to obtain an amorphous bar or a part of another shape that is formed by the Zr-based amorphous alloy. The casting may be pouring, suction casting, spray casting, or die casting. For example, the Zr-based amorphous alloy in the present invention may have any one of the combination of components listed in Table 1:

TABLE 1

| Serial Number | Alloy components |
|---|---|
| 1 | Zr57Ni3Cu29Al9Gd2 |
| 2 | Zr63Ni10Cu17.5Al7.5Er2 |
| 3 | Zr60.5Ni2Cu25Al12Er0.5 |
| 4 | Zr60Ni5Cu22Al12Dy1 |
| 5 | Zr54Cu30Al10Ni5Er1 |
| 6 | Zr46.9Ni8Cu36Al8Er0.1Y1 |
| 7 | Zr54.5Cu30Al10Ni5Tm0.5 |

TABLE 1-continued

| Serial Number | Alloy components |
|---|---|
| 8 | Zr50Cu35Al10Ni4Yb1 |
| 9 | Zr59.5Hf2Ni10Cu19Al8Er0.5Tm0.5Y0.5 |
| 10 | Zr60.5Hf2Cu19Ni10Al8Er0.5 |
| 11 | Zr60.5Ni2Cu25Al12Tm0.5 |
| 12 | Zr63Hf1.5Cu18Ni10Al7Yb0.5 |
| 13 | Zr60.5Hf2Cu19Ni10Al8Nd0.5 |
| 14 | Zr51Cu23Al10Ni15Er1 |
| 15 | Zr53.5Hf1Cu30Ni5Al10(Y,Er)0.5 |
| 16 | Zr52.8Hf2Cu30Ni5Al10La0.2 |
| 17 | Zr53Hf1Ni5Cu30Al10Ce1 |
| 18 | Zr47Hf0.5Cu36Ni8Al8Er0.5 |
| 19 | Zr51Hf1Cu30Al10Ni7Tm1 |
| 20 | Zr62Nb1Cu17Al8Ni10Er2 |
| 21 | Zr64Nb0.5Cu30Ni5Al10Er0.5 |
| 22 | Zr60Cu18Ni10Al8Nb2Er2 |
| 23 | Zr53Nb1Cu30Al10Ni5Tm1 |
| 24 | Zr59Nb2Cu19Al8Ni10Yb2 |

The method for manufacturing a Zr-based amorphous alloy may include the following steps:

Step 1: Components preparation

Components are prepared within the range of the formula at a specific atomic percent. For example, components are prepared according to each component and a specific atomic percent in Table 1.

In the preparation process, components of the alloy may be prepared according to the components and atomic percents in Table 1 by using materials such as metal rods, blocks, ingots and plates made of elements Zr, Hf, Nb, Ni, Cu, Al, Er, and the like, with a purity of 99.5%.

Step 2: Melting

The prepared raw materials are melted under a protection atmosphere or vacuum condition to achieve homogeneous fusion of all components.

The melting method is not limited. Any melting method is appropriate so long as metals of various components are thoroughly melted and fused. A melting device may also be any type of conventional melting device. In the embodiments of the present invention, the melting device is preferably an arc melting furnace or an induction melting furnace. That is, the prepared raw materials are placed into an arc furnace water-cooled copper crucible or an induction melting crucible and vacuum-pumped to $6\text{-}9\times10^{-1}$ Pa, and charged with argon of from 0.03 to 0.08 MPa as protection gas. Heating is applied until the materials are melted to form an alloy material whose components are completely homogeneous. The vacuum degree is preferably $8\times10^{-1}$ Pa, and the argon protection gas is preferably of 0.05 MPa.

Step 3: Casting and cooling to form an amorphous alloy

The melted alloy material is cast into a mold to cool down, so as to obtain the Zr-based amorphous alloy of the foregoing molecular formula according to the corresponding components.

The detailed steps maybe as follows: Place a specific amount of prepared master alloy into a high-frequency induction furnace graphite crucible; create a vacuum below 0.1 Pa, and charge argon of 0.05 MPa into the vacuum; heat the graphite crucible until the temperature is higher than the melting point of the alloy material so that the alloy material is completely melted down; turn over the graphite crucible and pour the melt into a copper mold to form amorphous rods; or, by using a die-casting method, lead the alloy into a feeding pool of a die-casting device, and use a die-casting mold to form parts of complex dimensions.

The cooling speed of the cooling processing is 1 to 10 K/second, so as to suppress crystallization and form a cylinder-shaped fully amorphous alloy of a 10 mm critical size.

FIG. 1 is an X ray diffraction (XRD) analysis result diagram of two formulas sampled randomly in the table. The XRD spectrum is a typical amorphous diffuse peak, without a diffraction peak of a crystal phase, indicating that the entire cast bar is a single amorphous phase. In the figure, 1# and 2# represent two sampled formulas Zr63Ni10Cu17.5Al7.5Er2 (2#) and Zr54Cu30Al10Ni5Er1 (5#), where the X coordinate represents an XRD diffraction angle (2θ), and the Y coordinate represents relative diffraction intensity.

In the embodiments of the present invention, trace quantities of rare earth elements (0.05-5 atomic percent) are added into an alloy to suppress a crystallization trend and improve melt stability; the rare earth elements can absorb oxygen in the alloy, adjust oxygen content of the alloy, suppress heterogeneous nucleation, avoid crystallization of liquid metal in a cooling process, enhance glass forming ability of the alloy, thereby widening the choice range of raw materials required for manufacturing an amorphous alloy. Moreover, a product of a high glass forming ability can be manufactured without using high-purity raw materials, and we can further reduce process requirements such as vacuum degree, which slashes production costs.

Embodiment 1

Embodiment 1 of the present invention provides a Zr-based amorphous alloy, whose components and atomic percents fulfill the following general formula:

$$Zr_aCu_bNi_cAl_dRe_e,$$

where a, b, c, d, and e are corresponding atomic percent content of elements in the amorphous alloy, and fulfill $56\leq a\leq 65$, $15\leq b\leq 32$, $2\leq c\leq 15$, $7\leq d\leq 13$, and $0.05\leq e\leq 2$ respectively. Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding mishch metal (Misch Metal).

Component preparation, melting, casting and cooling are performed according to the general formula and the method for manufacturing a Zr-based amorphous alloy, so as to form a Zr-based amorphous alloy expressed by the general formula.

In this embodiment, Re is preferably one of or any combination of Gd, Er, and Dy. For example, the Zr-based amorphous alloy expressed by the general formula specifically includes Zr57Ni3Cu29Al9Gd2, Zr63Ni10Cu17.5Al7.5Er2,Zr60.5Ni2Cu25Al12Er0.5, r60Ni5Cu22Al12Dy1, and the like.

Embodiment 2

Embodiment 2 of the present invention provides a Zr-based amorphous alloy, whose components and atomic percents fulfill the following general formula:

$$Zr_aCu_bNi_cAl_dRe_e,$$

where a, b, c, d, and e are corresponding atomic percent content of elements in the amorphous alloy, and fulfill $45\leq a\leq 55$, $25\leq b\leq 38$, $2\leq c\leq 15$, $7\leq d\leq 13$, and $0.05\leq e\leq 2$ respectively, and Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding mishch metal (Misch Metal).

Component preparation, melting, casting and cooling are performed according to the general formula and the method for manufacturing a Zr-based amorphous alloy, so as to form a Zr-based amorphous alloy expressed by the general formula.

In this embodiment, preferably, Re is Er and Y, or is one of or any combination of Er, Tm, and Yb. For example, the Zr-based amorphous alloy expressed by the general formula specifically includes Zr54Cu30Al10Ni5Er1, Zr46.9Ni8Cu36Al8Er0.1Y1, Zr54.5Cu30Al10Ni5Tm0.5, Zr50Cu35Al10Ni4Yb1, and the like.

Embodiment 3

Embodiment 3 of the present invention provides a Zr-based amorphous alloy, whose components and atomic percents fulfill the following general formula:

$(Zr,Hf)_a Cu_b Ni_c Al_d Re_e$, where a, b, c, d, and e are corresponding atomic percent content of elements in the amorphous alloy, and fulfill 58≤a≤65, 15≤b≤32, 2≤c≤15, 7≤d≤13, and 0.05≤e≤2 respectively, and Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding mishch metal (Misch Metal).

Component preparation, melting, casting and cooling are performed according to the general formula and the method for manufacturing a Zr-based amorphous alloy, so as to form a Zr-based amorphous alloy expressed by the general formula.

In this embodiment, Re is preferably one of or any combination of Er, Yb, Nd, and Tm; the percent content of Hf in (Zr, Hf) is from 0 to 8. For example, the Zr-based amorphous alloy expressed by the general formula specifically includes Zr59.5Hf2Ni10Cu19Al8Er0.5Tm0.5Y0.5, Zr60.5Hf2Cu19Ni10Al8Er0.5, Zr60.5Ni2Cu25Al12Tm0.5, Zr63Hf1.5Cu18Ni10Al7Yb0.5, Zr60.5Hf2Cu19Ni10Al8Nd0.5, and the like.

Embodiment 4

Embodiment 4 of the present invention provides a Zr-based amorphous alloy, whose components and atomic percents fulfill the following general formula:

$(Zr,Hf)_a Cu_b Ni_c Al_d Re_e$, where a, b, c, d, and e are corresponding atomic percent content of elements in the amorphous alloy, and fulfill 48≤a≤55, 25≤b≤38, 2≤c≤15, 7≤d≤13, and 0.05≤e≤2 respectively, and Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding mishch metal (Misch Metal).

Component preparation, melting, casting and cooling are performed according to the general formula and the method for manufacturing a Zr-based amorphous alloy, so as to form a Zr-based amorphous alloy expressed by the general formula.

In this embodiment, preferably, Re is Er and Y, or is one of or any combination of Er, La, Tm, and Ce; the percent content of Hf in (Zr, Hf) is from 0 to 8. For example, the Zr-based amorphous alloy expressed by the general formula specifically includes Zr51Cu23Al10Ni15Er1, Zr53.5Hf1Cu30Ni5Al10(Y, Er)0.5, Zr52.8Hf2Cu30Ni5Al10La0.2, Zr53Hf1Ni5Cu30Al10Ce1, Zr47Hf0.5Cu36Ni8Al8Er0.5, Zr51Hf1Cu30Al10Ni7Tm1, and the like.

Embodiment 5

Embodiment 5 of the present invention provides a Zr-based amorphous alloy, whose components and atomic percents fulfill the following general formula:

$(Zr,Nb)_a Cu_b Ni_c Al_d Re_e$, where a, b, c, d, and e are corresponding atomic percent content of elements in the amorphous alloy, and fulfill 48≤a≤65, 15≤b≤38, 2≤c≤15, 7≤d≤13, and 0.05≤e≤2 respectively, and Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. The Re element group may be obtained by adding mishch metal (Misch Metal).

Component preparation, melting, casting and cooling are performed according to the general formula and the method for manufacturing a Zr-based amorphous alloy, so as to form a Zr-based amorphous alloy expressed by the general formula.

In this embodiment, Re is preferably one of or any combination of Er, Tm, and Yb; the percent content of Nb in (Zr,Nb) is from 0 to 2. For example, the Zr-based amorphous alloy expressed by the general formula specifically includes Zr62Nb1Cu17Al8Ni10Er2, Zr64Nb0.5Cu30Ni5Al10Er0.5, Zr60Cu18Ni10Al8Nb2Er2, Zr53Nb1Cu30Al10Ni5Tm1, Zr59Nb2Cu19Al8Ni10Yb2, and the like.

Embodiment 6

Figure 2:
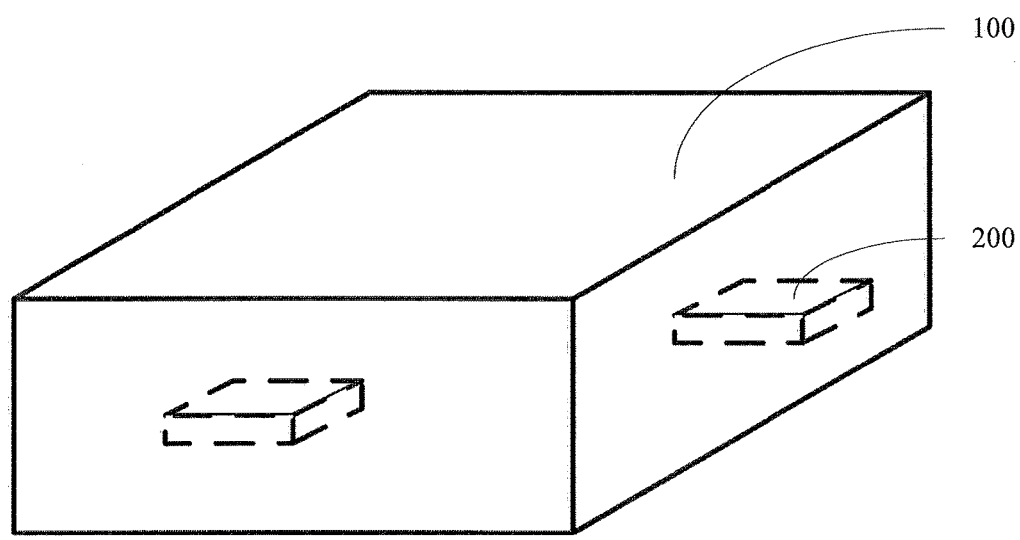
FIG. 2 is a schematic diagram of an electronic device according to Embodiment 8 of the present invention.

As shown in FIG. 2, Embodiment 9 of the present invention provides an electronic device, where the electronic device includes a casing 100 and electronic components 200 placed in the casing. The casing 100 is made of the foregoing Zr-based amorphous alloy. For example, the Zr-based amorphous alloy used for manufacturing the casing 100 includes Zr, Ni, Cu, Al, and one or more elements of rare earth, in which Zr maybe partly replaced with Hf or/and Nb. An atomic percent of each element in the final amorphous alloy fulfills the following general formula:

$(Zr,Hf,Nb)_a Cu_b Ni_c Al_d Re_e$, where a, b, c, d, and e are corresponding atomic percent content of elements in the Zr-based amorphous alloy, 45≤a≤65, 15≤b≤40, 0.1≤c≤15, 5≤d≤15, 0.05≤e≤5, a+b+c+d+e≤100, and Re is one or more elements of rare earth, that is, Re is one of or any combination of elements La, Ce, Pm, Ho, Er, Nd, Gd, Dy, Sc, Eu, Tm, Tb, Pr, Sm, Yb, and Lu, or Re is combined with Y and one of or any combination of elements La, Ce, Pm, Ho, Er, Nd, Gd, Dy, Sc, Eu, Tm, Tb, Pr, Sm, Yb, and Lu. In some embodiments, the Re is preferably one of or any combination of elements La, Nd, Dy, Er, Tm, and Yb. The Re element group may be obtained by adding mishch metal (Misch Metal).

The casing 100 may be made of the Zr-based amorphous alloy described in any one of Embodiments 1 to 8.

The casing 100 made of the Zr-based amorphous alloy provides high mechanical performance, such as high rigidity, high intensity, and high resilience, and has merits such as low difficulty in making the Zr-based amorphous alloy and relatively low costs.

It should be noted that the components described in the embodiments of the present invention do not involve non-metal components such as oxygen and nitrogen, but those skilled in the art know that a certain content of non-metal elements such as oxygen and nitrogen is inevitable in an alloy. For example, in the process of melting a Zr-based amorphous alloy in the embodiments of the present invention, oxidation may occur and introduce certain oxygen content, which is inevitable in the current manufacturing process. Therefore, amorphous alloys of homogeneous metal components combined with certain non-metal components shall fall within the protection scope of the present invention.

Persons of ordinary skill in the art should understand that all or a part of the processes of the method in the embodiments may be implemented by a computer program instructing relevant hardware. The program may be stored in a computer readable storage medium. When the program is run, the processes of the method in the embodiments are performed. The storage medium may be a magnetic disk, an optical disk, a read-only memory (Read-Only Memory, ROM), a random access memory (Read-Only Memory, RAM), or the like.

Finally, the foregoing embodiments are merely intended for describing the technical solutions of the embodiments of the present invention rather than limiting the present invention. Although the embodiments of the present invention are described in detail with reference to preferred embodiments, persons of ordinary skill in the art should understand that they may still make modifications to the technical solutions described in the embodiments of the present invention or make equivalent replacements to some technical features thereof, without departing from the spirit and scope of the technical solutions of the embodiments of the present invention.

What is claimed is:

1. A zirconium-based (Zr-based) amorphous alloy, wherein the Zr-based amorphous alloy comprises one of the following formulas:

$Zr_{57}Cu_{29}Ni_3Al_9Gd_2$, $Zr_{63}Cu_{17.5}Ni_{10}Al_{7.5}Er_2$, $Zr_{60.05}Cu_{25}Ni_2Al_{12}Er_{0.5}$, or $Zr_{60}Cu_{22}Ni_5Al_{12}Dy_1$.

2. A zirconium-based (Zr-based) amorphous alloy, wherein the Zr-based amorphous alloy has one of the following formulas:

$Zr_{46.9}Cu_{36}Ni_8Al_8Er_{0.1}Y_1$, $Zr_{54.5}Cu_{30}Ni_5Al_{10}Tm_{0.5}$, or $Zr_{50}Cu_{35}Ni_4Al_{10}Yb_1$.

3. A zirconium-based (Zr-based) amorphous alloy, wherein the Zr-based amorphous alloy has one of the following formulas:

$Zr_{59.5}Hf_2Ni_{10}Cu_{19}Al_8Er_{0.5}Tm_{0.5}Y_{0.5}$, $Zr_{60.5}Hf_2Cu_{19}Ni_{10}Al_8Er_{0.5}$, $Zr_{60.5}Ni_2Cu_{25}Al_{12}Tm_{0.5}$, $Zr_{63}Hf_{1.5}Cu_{18}Ni_{10}Al_7Yb_{0.5}$, or $Zr_{60.5}Hf_2Cu_{19}Ni_{10}Al_8Nd_{0.5}$.

4. A zirconium-based (Zr-based) amorphous alloy, wherein the Zr-based amorphous alloy has one of the following formulas:

$Zr_{53.5}Hf_1Cu_{30}Ni_5Al_{10}(Y, Er)_{0.5}$, $Zr_{52.8}Hf_2Cu_{30}Ni_5Al_{10}La_{0.2}$, $Zr_{53}Hf_1Ni_5Cu_{30}Al_{10}Ce_1$, or $Zr_{51}Hf_1Cu_{30}Al_{10}Ni_7Tm_1$.

5. A zirconium-based (Zr-based) amorphous alloy, wherein the Zr-based amorphous alloy has one of the following formulas:

$Zr_{62}Nb_1Cu_{17}Al_8Ni_{10}Er_2$, $Zr_{60}Cu_{18}Ni_{10}Al_8Nb_2Er_2$, $Zr_{53}Nb_1Cu_{30}Al_{10}Ni_5Tm_1$, or $Zr_{59}Nb_2Cu_{19}Al_8Ni_{10}Yb_2$.

6. A method for manufacturing a zirconium-based (Zr-based) amorphous alloy, comprising:
melting metal raw materials within a protection atmosphere or vacuum condition, and then performing casting, cooling, and molding to form a Zr-based amorphous alloy,
wherein the metal raw materials comprise a purity of less than 99.9%,
wherein in the melting process, the raw materials are subjected to a vacuum degree of $6\text{-}9\times10^{-1}$ Pa and with charged argon protection gas from 0.03 to 0.08 MPa, and
wherein the Zr-based amorphous alloy has one of the following formulas:

$Zr_{57}Cu_{29}Ni_3Al_9Gd_2$, $Zr_{63}Cu_{17.5}Ni_{10}Al_{7.5}Er_2$, $Zr_{60.5}Cu_{25}Ni_2Al_{12}Er_{0.5}$, or $Zr_{60}Cu_{22}Ni_5Al_{12}Dy_1$.

7. The manufacturing method according to claim 6, wherein in the melting process, a vacuum degree is $8\times10^{-1}$ Pa, and a charged argon protection gas is of 0.05 MPa.

8. An electronic device, comprising:
a casing and electronic components placed in the casing, wherein the casing comprises a zirconium-based (Zr-based) amorphous alloy, and the Zr-based amorphous alloy has one of the following formulas:

$Zr_{57}Cu_{29}Ni_3Al_9Gd_2$, $Zr_{63}Cu_{17.5}Ni_{10}Al_{7.5}Er_2$, $Zr_{60.5}Cu_{25}Ni_2Al_{12}Er_{0.5}$, or $Zr_{60}Cu_{22}Ni_5Al_{12}Dy_1$.

9. An electronic device comprising a Zr-based amorphous alloy that has one of the following formulas:

$Zr_{46.9}Cu_{36}Ni_8Al_8Er_{0.1}Y_1$, $Zr_{54.5}Cu_{30}Ni_5Al_{10}Tm_{0.5}$, or $Zr_{50}Cu_{35}Ni_4Al_{10}Yb_1$.

10. An electronic device comprising:
a casing and electronic components placed in the casing, wherein the casing comprises a zirconium-based (Zr-based) amorphous alloy, and the Zr-based amorphous alloy has one of the following formulas:

$Zr_{59.5}Hf_2Ni_{10}Cu_{19}Al_8Er_{0.5}Tm_{0.5}Y_{0.5}$, $Zr_{60.5}Hf_2Cu_{19}Ni_{10}Al_8Er_{0.5}$, $Zr_{60.5}Ni_2Cu_{25}Al_{12}Tm_{0.5}$, $Zr_{63}Hf_{1.5}Cu_{18}Ni_{10}Al_7Yb_{0.5}$, or $Zr_{60.5}Hf_2Cu_{19}Ni_{10}Al_8Nd_{0.5}$.

11. An electronic device comprising:
a casing and electronic components placed in the casing, wherein the casing comprises a zirconium-based (Zr-based) amorphous alloy, and the Zr-based amorphous alloy has one of the following formulas:

$Zr_{53.5}Hf_1Cu_{30}Ni_5Al_{10}(Y, Er)_{0.5}$, $Zr_{52.8}Hf_2Cu_{30}Ni_5Al_{10}La_{0.2}$, $Zr_{53}Hf_1Ni_5Cu_{30}Al_{10}Ce_1$, or $Zr_{51}Hf_1Cu_{30}Al_{10}Ni_7Tm_1$.

12. An electronic device comprising a Zr-based amorphous alloy that has one of the following formulas:

$Zr_{62}Nb_1Cu_{17}Al_8Ni_{10}Er_2$, $Zr_{60}Cu_{18}Ni_{10}Al_8Nb_2Er_2$, $Zr_{53}Nb_1Cu_{30}Al_{10}Ni_5Tm_1$, or $Zr_{59}Nb_2Cu_{19}Al_8Ni_{10}Yb_2$.

* * * * *